(12) United States Patent
Clark, Jr. et al.

(10) Patent No.: US 8,039,376 B2
(45) Date of Patent: Oct. 18, 2011

(54) METHODS OF CHANGING THRESHOLD VOLTAGES OF SEMICONDUCTOR TRANSISTORS BY ION IMPLANTATION

(75) Inventors: William F. Clark, Jr., Essex Junction, VT (US); Edward Joseph Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 715 days.

(21) Appl. No.: 11/939,578

(22) Filed: Nov. 14, 2007

(65) Prior Publication Data

US 2009/0124069 A1    May 14, 2009

(51) Int. Cl.
*H01L 21/425* (2006.01)

(52) U.S. Cl. ........................... 438/525; 438/527

(58) Field of Classification Search ............ 438/510, 438/528, 525, 527
See application file for complete search history.

(56) References Cited

U.S. PATENT DOCUMENTS

| | | | |
|---|---|---|---|
| 6,492,212 B1 | 12/2002 | Ieong et al. | |
| 6,936,882 B1 | 8/2005 | Ahmed et al. | |
| 7,091,566 B2 | 8/2006 | Zhu et al. | |
| 7,098,477 B2 | 8/2006 | Zhu et al. | |
| 7,101,741 B2 | 9/2006 | Fried et al. | |
| 7,145,220 B2 | 12/2006 | Morikado | |
| 7,449,373 B2 * | 11/2008 | Doyle et al. | 438/149 |
| 2004/0036126 A1 * | 2/2004 | Chau et al. | 257/401 |
| 2006/0088967 A1 | 4/2006 | Hsiao et al. | |
| 2007/0034971 A1 | 2/2007 | Anderson et al. | |

* cited by examiner

*Primary Examiner* — Bradley K Smith
(74) *Attorney, Agent, or Firm* — Schmeiser, Olsen & Watts; Richard M. Kotulak

(57) ABSTRACT

A method for forming a semiconductor structure. The method includes providing a semiconductor structure including a semiconductor substrate. The semiconductor substrate includes (i) a top substrate surface which defines a reference direction perpendicular to the top substrate surface and (ii) a semiconductor body region. The method further includes implanting an adjustment dose of dopants of a first doping polarity into the semiconductor body region by an adjustment implantation process. Ion bombardment of the adjustment implantation process is in the reference direction. The method further includes (i) patterning the semiconductor substrate resulting in side walls of the semiconductor body region being exposed to a surrounding ambient and then (ii) implanting a base dose of dopants of a second doping polarity into the semiconductor body region by a base implantation process. Ion bombardment of the base implantation process is in a direction which makes a non-zero angle with the reference direction.

17 Claims, 7 Drawing Sheets

METHODS OF CHANGING THRESHOLD VOLTAGES OF SEMICONDUCTOR TRANSISTORS BY ION IMPLANTATION

FIELD OF THE INVENTION

The present invention relates generally to methods for changing threshold voltages of transistors and more particularly to methods for changing threshold voltages of transistors by ion implantation.

BACKGROUND OF THE INVENTION

In a conventional process for changing threshold voltage of a transistor on a chip, the semiconductor body of the transistor can be doped with dopants by ion implantation. Control of the value of the threshold voltage is critical to good performance and low power consumption of the circuits employing the transistors. In Multi-Gate FETs (MuGFETs), such as Fin-FETs, Tri-Gate, and other related structures, doping the MuGFET body is best performed with angled implants at some point following fin (body) formation, as this allows total dose delivery to the body to be minimally affected by incidental variations in fin dimensions. When multiple threshold-voltages are required for the same polarity (e.g. n-type) FET, it is desirable that the spacing between two FETs with differing threshold voltages can be as close, physically, as two such FETs having the same threshold voltage; this provides for high circuit density and low manufacturing cost. Unfortunately, this spacing is such that the blocking resist used to allow such threshold-adjusting implants into one FET and not an adjacent one, prohibits the use of tilted, or angled, implants that are needed to dope the fins in a uniform manner. Therefore, there is always a need for a method of changing the threshold voltage of a transistor that is better than that of the prior art.

SUMMARY OF THE INVENTION

The present invention provides a semiconductor structure fabrication method, comprising providing a semiconductor structure which includes a semiconductor substrate, wherein the semiconductor substrate includes a top substrate surface which defines a reference direction perpendicular to the top substrate surface and pointing from outside to inside of the semiconductor substrate, and wherein the semiconductor substrate further includes a semiconductor body region; then implanting an adjustment dose of dopants of a first doping polarity into the semiconductor body region by an adjustment implantation process, wherein ion bombardment of the adjustment implantation process is in the reference direction; then patterning the semiconductor substrate resulting in side walls of the semiconductor body region being exposed to a surrounding ambient; and then implanting a base dose of dopants of a second doping polarity into the semiconductor body region by a base implantation process, wherein ion bombardment of the base implantation process is in a direction which makes a non-zero angle with the reference direction.

The present invention provides a method of changing the threshold voltage of a transistor that is better than that of the prior art.

DETAILED DESCRIPTION OF THE INVENTION

FIGS. 1A-1M show cross-section views used to illustrate a fabrication process of a semiconductor structure 100, in accordance with embodiments of the present invention. More specifically, with reference to FIG. 1A, the fabrication process of the semiconductor structure 100 starts with an SOI (Silicon On Insulator) substrate 110+120+130. The SOI substrate 110+120+130 comprises a silicon substrate 110, a BOX (buried oxide) layer 120 on top of the silicon substrate 110, and an active silicon layer 130 on top of the BOX layer 120. The SOI substrate 110+120+130 can be formed by a conventional method. Alternatively, the substrate can comprise a conventional (bulk) silicon wafer, and furthermore, may further comprise an isolation layer comprising either doped silicon or silicon-germanium in lieu of the BOX layer 120.

Figure 1A:
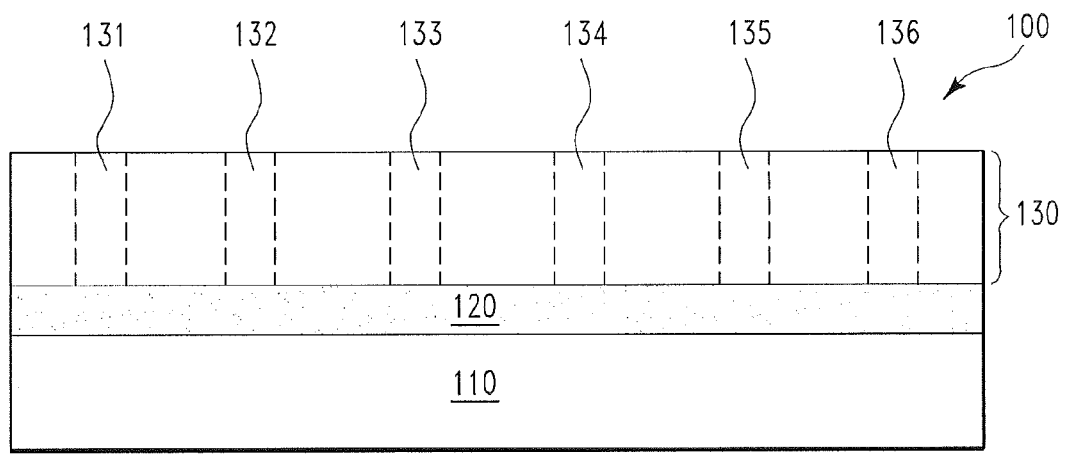
FIGS. 1A-1M show cross-section views used to illustrate a fabrication process of a semiconductor structure, in accordance with embodiments of the present invention.

Consider the case where FETs (field effect transistors) are to be formed on the semiconductor structure 100 of FIG. 1A. More specifically, consider the case where a first FET (not shown), a second FET (not shown), and a third FET (not shown) having threshold voltages Vt1, Vt2, and Vt3 are to be formed on body regions 131, 132, and 133, respectively. Assume further that Vt1, Vt2, and Vt3 are achieved by, among other things, individually doping the body regions 131, 132, and 133, respectively. Assume further that if the body regions 131, 132, and 133 are not individually doped, then the threshold voltages of the first, second, and third FETs would be Vt01, Vt02, and Vt03, respectively. Therefore, the individual doping of the body regions 131, 132, and 133 results in the changes $\Delta Vt1$, $\Delta Vt2$, and $\Delta Vt3$ in the threshold voltages of the first, second, and third FETs, respectively, wherein:

$$\Delta Vt1 = Vt1 - Vt01 \qquad (1)$$

$$\Delta Vt2 = Vt2 - Vt02 \qquad (2)$$

$$\Delta Vt3 = Vt3 - Vt03 \qquad (3)$$

It is well known that implantation of p-type dopants in the body region of an FET results in an increase in the threshold voltage of the FET. In contrast, implantation of n-type dopants in the body region of an FET results in a decrease in the threshold voltage of the FET. Assume that $\Delta Vt1 > 0$, $\Delta Vt2 > 0$, and $\Delta Vt3 > 0$. Therefore, $\Delta Vt1$, $\Delta Vt2$, and $\Delta Vt3$ can be achieved by implanting p-type dopants in the body regions 131, 132, and 133, respectively.

Let Dp1, Dp2, and Dp3 be the three doses of p-type dopants that need to be implanted into the body regions 131, 132, and 133 to achieve $\Delta Vt1$, $\Delta Vt2$, and $\Delta Vt3$, respectively. It should be noted that a dose of dopants in a body region is the number of dopant atoms that are implanted into the body region. Also, let Db be a first base dose of p-type dopants, wherein Db>0, Db<Dp1, Db<Dp2, and Db<Dp3.

As a result, in one embodiment, Dp1 can be implanted into the body region 131 by (i) implanting a first adjustment dose of p-type dopants Da1 and then (ii) implanting the first base dose Db into the body region 131, wherein Da1+Db=Dp1. Similarly, Dp2 can be implanted into the body region 132 by (i) implanting a second adjustment dose of p-type dopants Da2 and then (ii) implanting the first base dose Db into the body region 132, wherein Da2+Db=Dp2. Similarly, Dp3 can be implanted into the body region 133 by (i) implanting a third adjustment dose of p-type dopants Da3 and then (ii) implanting the first base dose Db into the body region 133, wherein Da3+Db=Dp3. Note that in practice, one can choose the first base dose, Db to directly achieve one of the desired values of Vt, in which case no adjustment implant (i.e. an adjustment dose of value zero) is employed. In one embodiment, Da1, Da2, and Da3 are implanted into the body regions 131, 132, and 133 by individual first, second, and third adjustment Vt implantation processes, respectively, whereas Db is implanted into each of the body regions 131, 132, and 133 by a same first base Vt implantation process.

Assume that a fourth FET (not shown), a fifth FET (not shown), and a sixth FET (not shown) having threshold voltages Vt4, Vt5, and Vt6 are to be formed on body regions 134, 135, and 136 of the active silicon layer 130, respectively. Assume further that Vt4, Vt5, and Vt6 are achieved by, among other things, individually doping the body regions 134, 135, and 136, respectively. Assume further that if the body regions 134, 135, and 136 are not individually doped, then the threshold voltages of the fourth, fifth, and sixth FETs would be Vt04, Vt05, and Vt06, respectively. Therefore, the individual doping of the body regions 134, 135, and 136 results in the changes ΔVt4, ΔVt5, and ΔVt6 in the threshold voltages of the fourth, fifth, and sixth FETs, respectively, wherein:

$$\Delta Vt4 = Vt4 - Vt04 \quad (4)$$

$$\Delta Vt5 = Vt5 - Vt05 \quad (5)$$

$$\Delta Vt6 = Vt6 - Vt06 \quad (6)$$

Assume that ΔVt4>0, ΔVt5>0, and ΔVt6>0. Therefore, ΔVt4, ΔVt5, and ΔVt6 can be achieved by implanting p-type dopants in the body regions 134, 135, and 136, respectively.

Let Dp4, Dp5, and Dp6 be the three doses of p-type dopants that need to be implanted into the body regions 134, 135, and 136 to achieve ΔVt4, ΔVt5, and ΔVt6, respectively. Also, let Db' be a second base dose of p-type dopants, wherein Db'>0, Db'<Dp4, Db'<Dp5, and Db'<Dp6. As a result, in one embodiment, Dp4 can be implanted into the body region 134 by (i) implanting a fourth adjustment dose of p-type dopants Da4 and then (ii) implanting the second base dose Db' into the body region 134, wherein Da4+Db'=Dp4. Similarly, Dp5 can be implanted into the body region 135 by (i) implanting a fifth adjustment dose of p-type dopants Da5 and then (ii) implanting the second base dose Db' into the body region 135, wherein Da5+Db'=Dp5. Similarly, Dp6 can be implanted into the body region 136 by (i) implanting a sixth adjustment dose of p-type dopants Da6 and then (ii) implanting the second base dose Db' into the body region 136, wherein Da6+Db'=Dp6. In one embodiment, Da4, Da5, and Da6 are implanted into the body regions 134, 135, and 136 by individual fourth, fifth, and sixth adjustment Vt implantation processes, respectively, whereas Db' is implanted into each of the body regions 134, 135, and 136 by a same second base Vt implantation process.

In one embodiment, the implantation processes described above can be carried out in detail as follows.

Figure 1B:
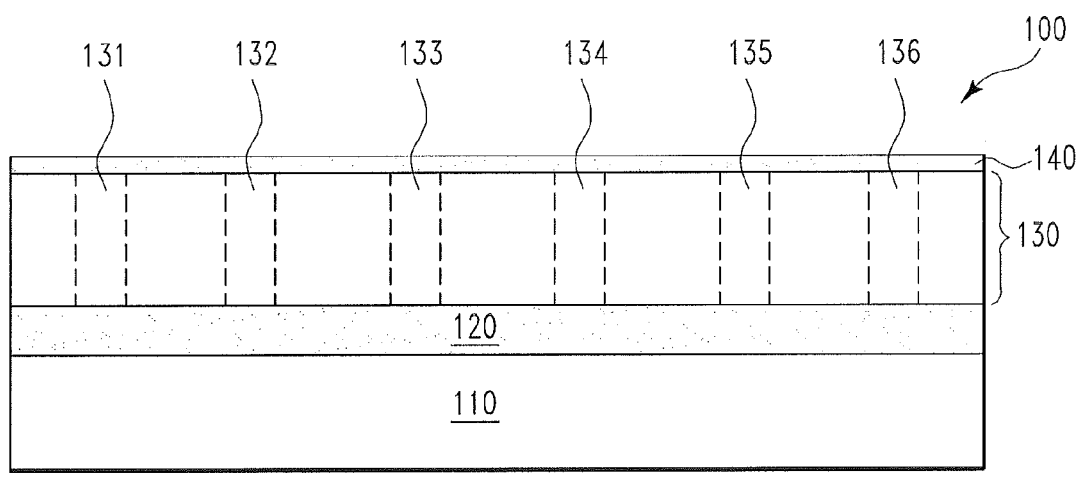

With reference to FIG. 1B, in one embodiment, a pad film 140 is formed on top of the active silicon layer 130. The pad film 140 can comprise silicon dioxide. The pad film 140 can be formed by (i) CVD (Chemical Vapor Deposition) of silicon dioxide on top of the active silicon layer 130 or (ii) thermally oxidizing the top surface of the active silicon layer 130 resulting in the pad film 140 on top of the active silicon layer 130.

Figure 1C:
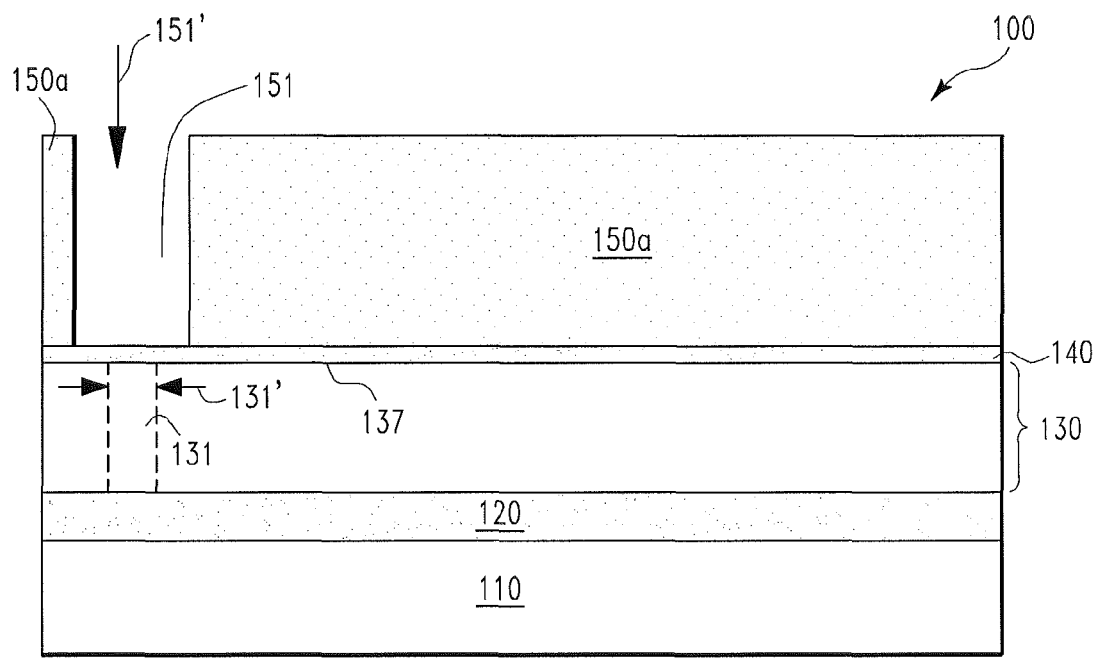

Next, with reference to FIG. 1C, in one embodiment, a photoresist layer 150a is formed on top of the pad film 140. The photoresist layer 150a can be formed by a spin-on process followed by baking.

Next, in one embodiment, the photoresist layer 150a is patterned resulting in a photoresist trench 151 in the photoresist layer 150a such that the entire body region 131 overlaps the photoresist trench 151 in a direction defined by an arrow 151' (also called a direction 151') which is perpendicular to the top surface 137 of the active silicon layer 130. Moreover, the other body regions 132, 133, 134, 135, and 136 (FIG. 1A) do not overlap the photoresist trench 151 in the direction 151' (i.e., the entire body regions 132, 133, 134, 135, and 136 overlap the patterned photoresist layer 150a in the direction 151').

Next, in one embodiment, the body region 131 is doped with p-type dopants by the first adjustment Vt implantation process such that Da1 is implanted into the body region 131. More specifically, the body region 131 is doped by implanting p-type dopants into the body region 131 with the patterned photoresist layer 150a as a blocking mask. In one embodiment, the bombarding direction of the first adjustment Vt implantation process is in the direction 151'. The first adjustment Vt implantation process hereafter is referred to as the first adjustment Vt implantation process 151'. Hereafter, an ion implantation process and the arrow representing the direction of the ion bombardment of the ion implantation process have the same reference numeral for simplicity. After the first adjustment Vt implantation process 151' is performed, the photoresist layer 150a is removed by wet etching.

In summary, the body region 131 is doped with Da1 by performing the first adjustment Vt implantation process 151' through the photoresist trench 151 using the patterned photoresist layer 150a as a blocking mask.

Figure 1D:
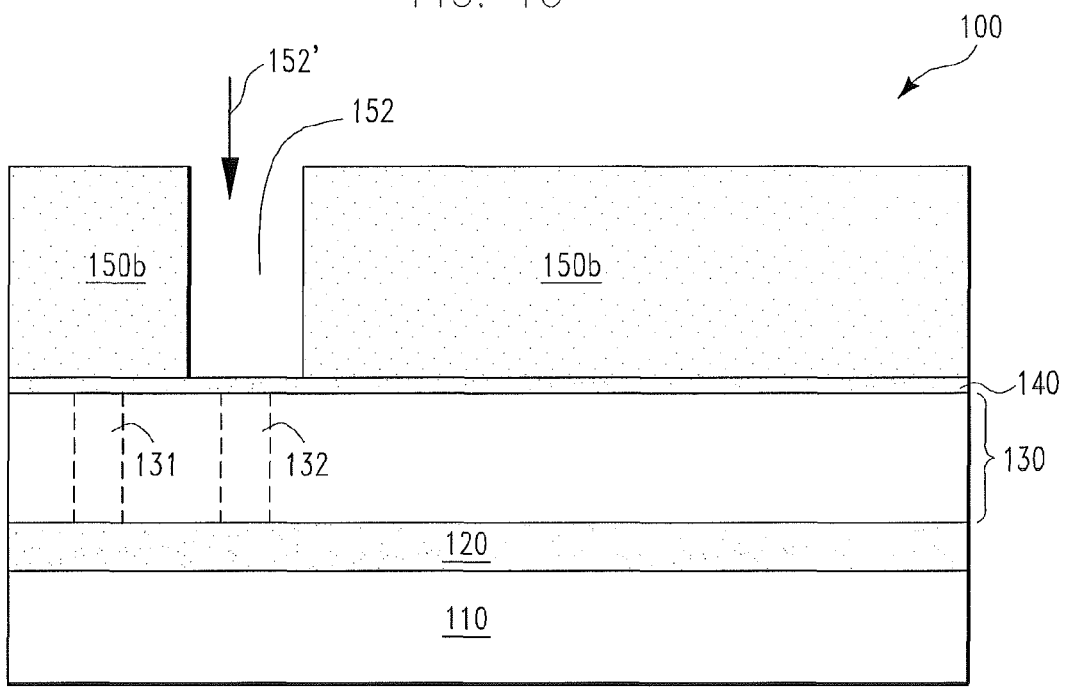

Next, with reference to FIG. 1D, in one embodiment, the body region 132 is doped with Da2. The body region 132 is doped with Da2 in a manner similar to the manner in which the body region 131 is doped with Da1 in FIG. 1C. More specifically, the body region 132 is doped with Da2 by performing the second adjustment Vt implantation process 152' through a photoresist trench 152 using a patterned photoresist layer 150b as a blocking mask.

Figure 1E:
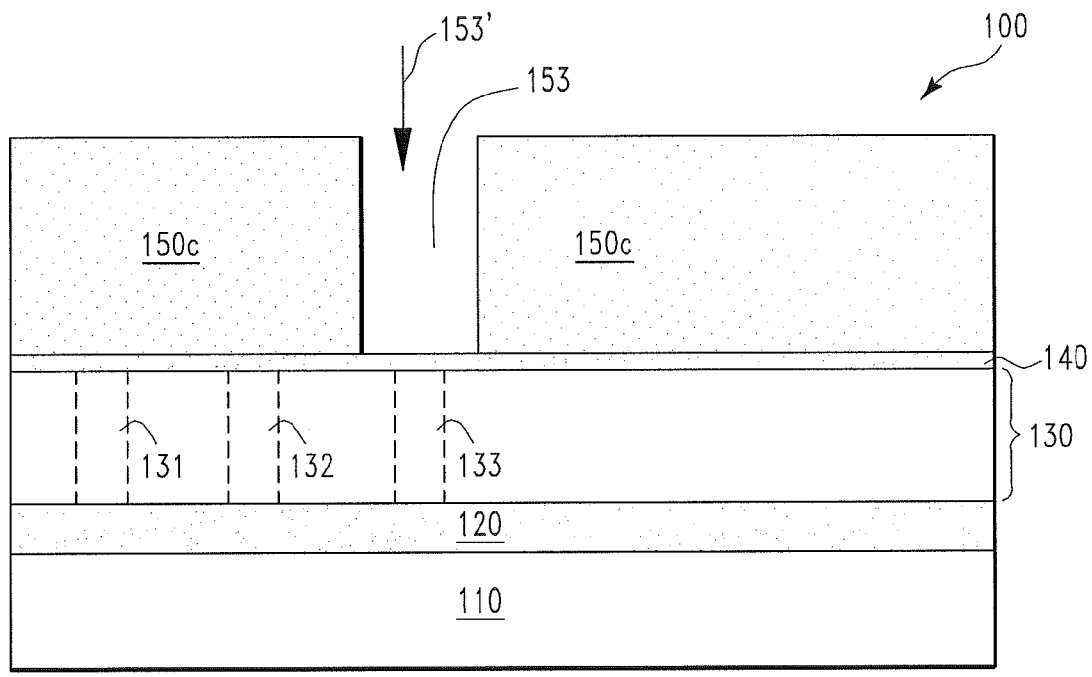

Next, with reference to FIG. 1E, in one embodiment, the body region 133 is doped with Da3. The body region 133 is doped with Da3 in a manner similar to the manner in which the body region 131 is doped with Da1 in FIG. 1C. More specifically, the body region 133 is doped with Da3 by performing the third adjustment Vt implantation process 153' through a photoresist trench 153 using a patterned photoresist layer 150c as a blocking mask.

Figure 1F:
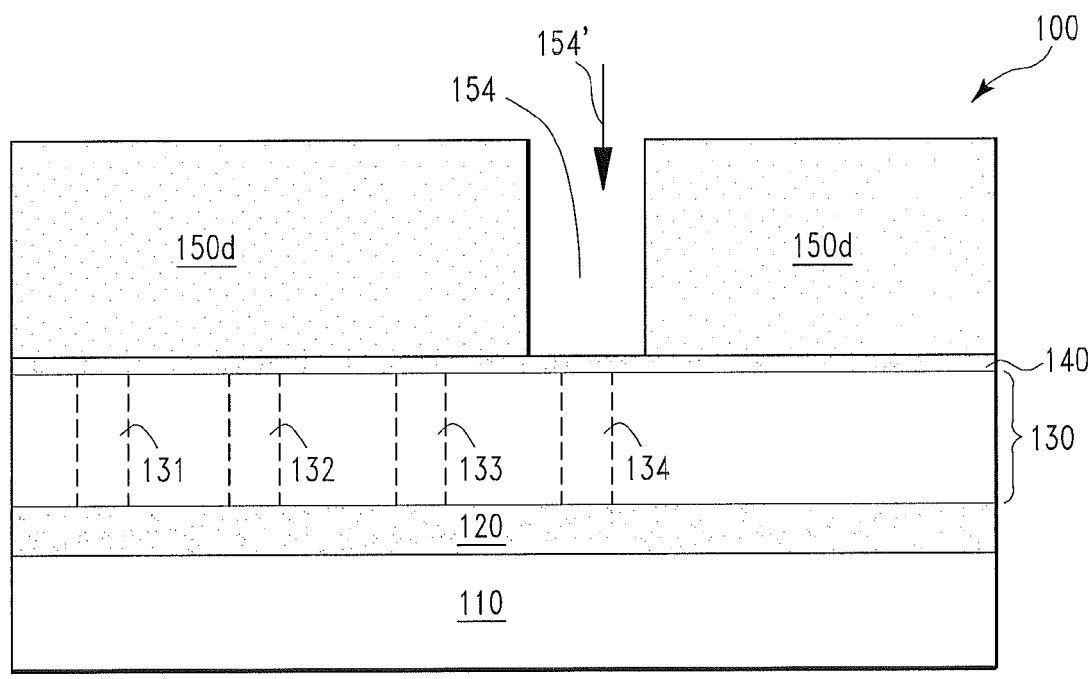

Next, with reference to FIG. 1F, in one embodiment, the body region 134 is doped with Da4. The body region 134 is doped with Da4 in a manner similar to the manner in which the body region 131 is doped with Da1 in FIG. 1C. More specifically, the body region 134 is doped with Da4 by performing the fourth adjustment Vt implantation process 154' through a photoresist trench 154 using a patterned photoresist layer 150d as a blocking mask.

Figure 1G:
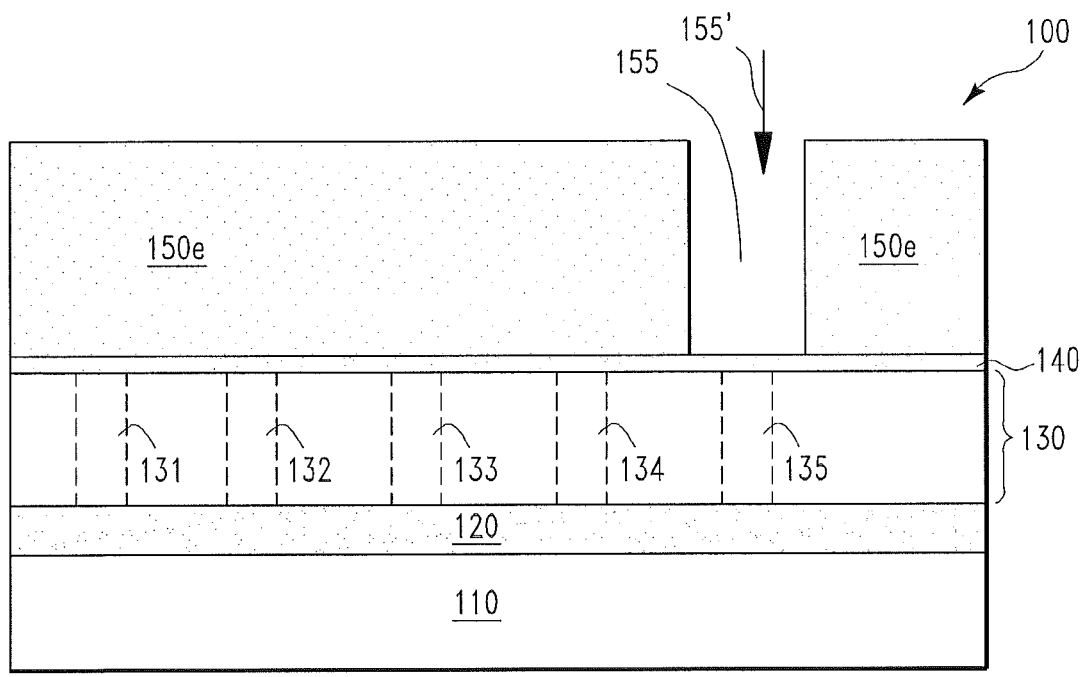

Next, with reference to FIG. 1G, in one embodiment, the body region 135 is doped with Da5. The body region 135 is doped with Da5 in a manner similar to the manner in which the body region 131 is doped with Da1 in FIG. 1C. More specifically, the body region 135 is doped with Da5 by performing the fifth adjustment Vt implantation process 155' through a photoresist trench 155 using a patterned photoresist layer 150e as a blocking mask.

Figure 1H:
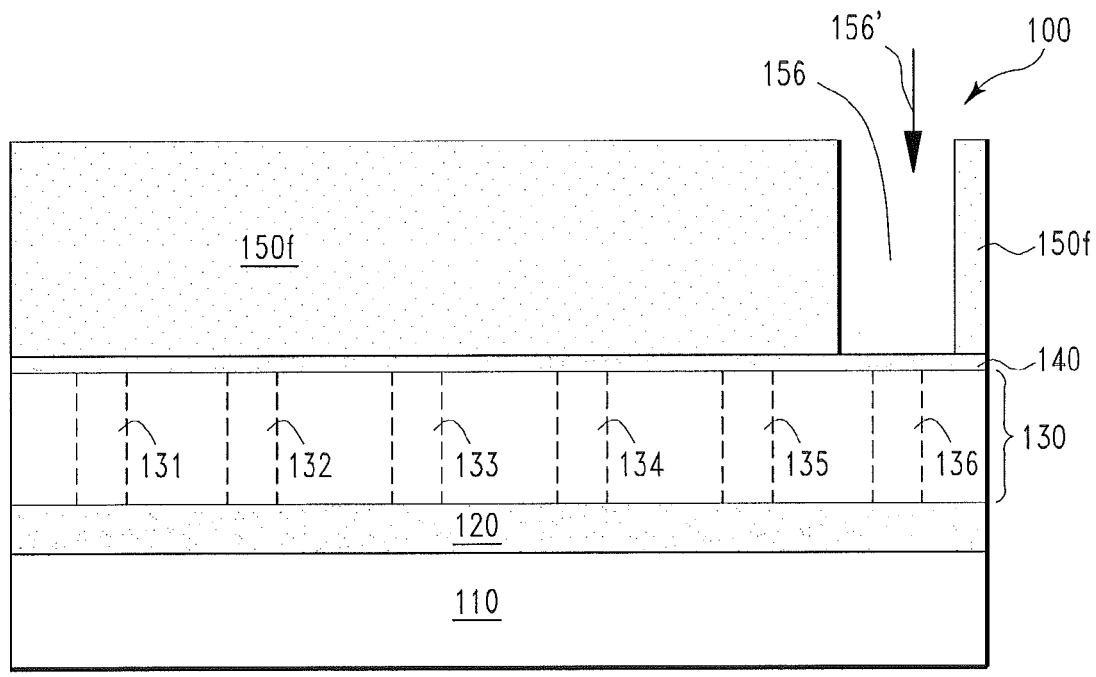

Next, with reference to FIG. 1H, in one embodiment, the body region 136 is doped with Da6. The body region 136 is doped with Da6 in a manner similar to the manner in which the body region 131 is doped with Da1 in FIG. 1C. More specifically, the body region 136 is doped with Da6 by performing the sixth adjustment Vt implantation process 156' through a photoresist trench 156 using a patterned photoresist layer 150f as a blocking mask.

Figure 1I:
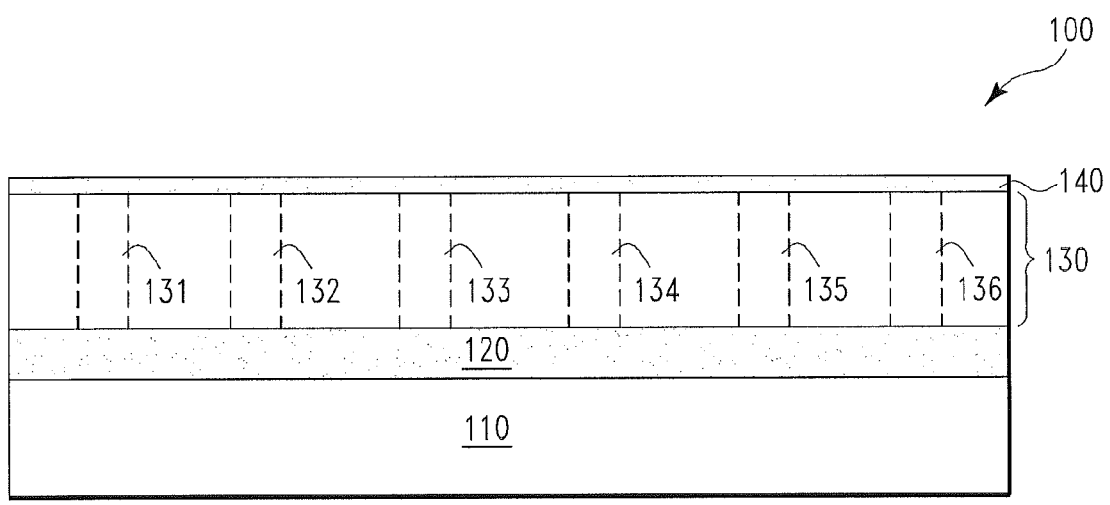
Figure 1J:
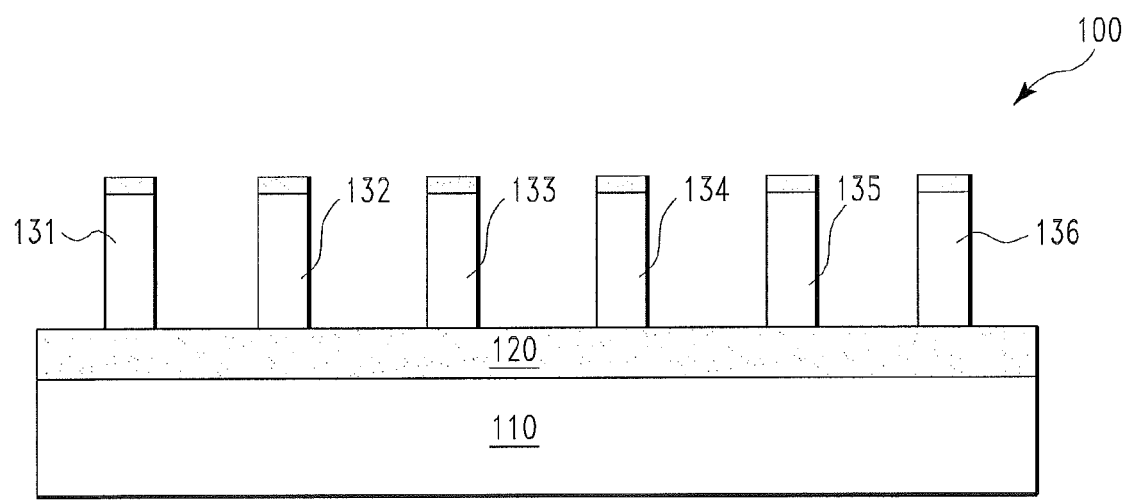

Next, in one embodiment, after the removal of the patterned photoresist layer 150f (FIG. 1H) resulting in structure 100 of FIG. 1I, the pad film 140 and the active silicon layer 130 are patterned resulting in the body regions 131, 132, 133, 134, 135, and 136 of FIG. 1J. Hereafter, the body regions 131, 132, 133, 134, 135, and 136 are called the fin regions 131, 132, 133, 134, 135, and 136, respectively.

Figure 1K:
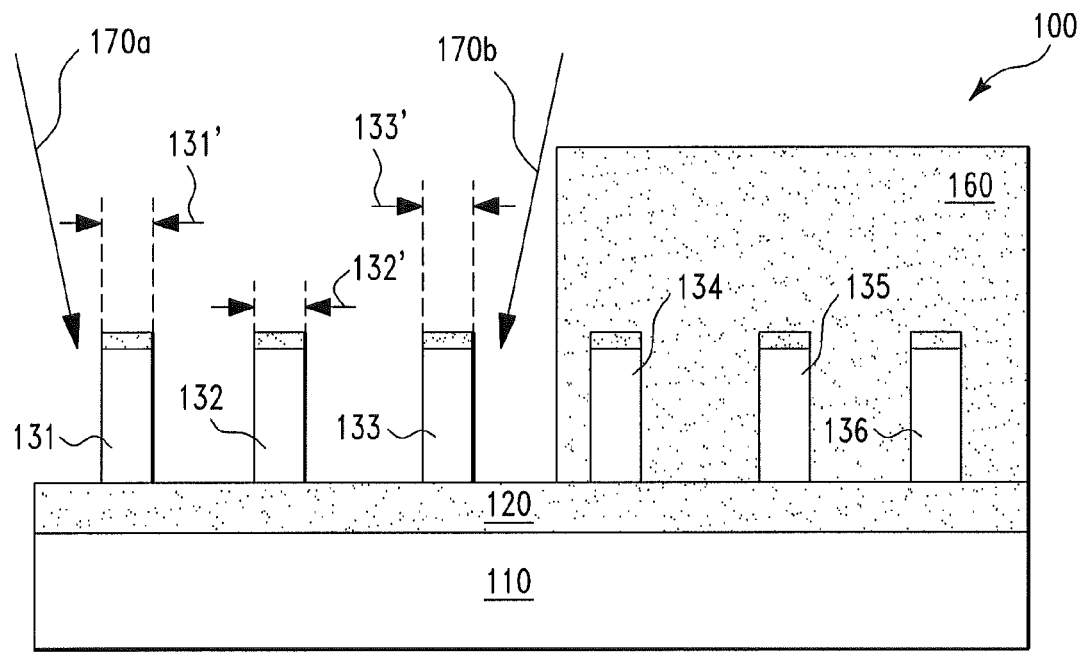

Next, with reference to FIG. 1K, in one embodiment, a photoresist region 160 is formed on top of the fin regions 134, 135, and 136 such that the fin regions 134, 135, and 136 are not exposed to the surrounding ambient and such that the fin regions 131, 132, and 133 are exposed to the surrounding ambient. The photoresist region 160 can be formed by a lithographic process.

Next, in one embodiment, the fin regions 131, 132, and 133 are doped with p-type dopants by the first base Vt implantation process such that Db is implanted into each of the fin regions 131, 132, and 133. More specifically, the fin regions 131, 132, and 133 are doped by implanting p-type dopants into the fin regions 131, 132, and 133 with the photoresist region 160 as a blocking mask. In one embodiment, the ion bombardment of the first base Vt implantation process is performed in two bombarding directions defined by arrows 170a and 170b (also called directions 170a and 170b). The directions 170a and 170b are not perpendicular to the top surface 137 of the active silicon layer 130 (FIG. 1C). Alternatively, the ion bombardment of the first base Vt implantation process is performed in one of two directions 170a and 170b. In one embodiment, the energies of ions incident on the fin regions 131, 132, and 133 are sufficiently small such that the first base dose Db in each of the fin regions 131, 132, and 133 created by the first base Vt implantation process essentially do not depend on the thicknesses 131', 132', and 133' of the fin regions 131, 132, and 133, respectively.

As a result, the combination of Da1 and Db in the fin region 131 results in Dp1 in the fin region 131. Similarly, the combination of Da2 and Db in the fin region 132 results in Dp2 in the fin region 132. Similarly, the combination of Da3 and Db in the fin region 133 results in Dp3 in the fin region 133. Because the fin regions 134, 135, and 136 are covered by the photoresist region 160, the fin regions 134, 135, and 136 are not affected by the first base Vt implantation process. After the first base Vt implantation process is performed, the photoresist region 160 is removed by wet etching. In one embodiment, the spacing (i.e., horizontal distance) of the fins 131, 132, 133 and the spacing of the fins 134, 135, 136 each are smaller than the spacing of the fins 133 and 134.

Figure 1L:
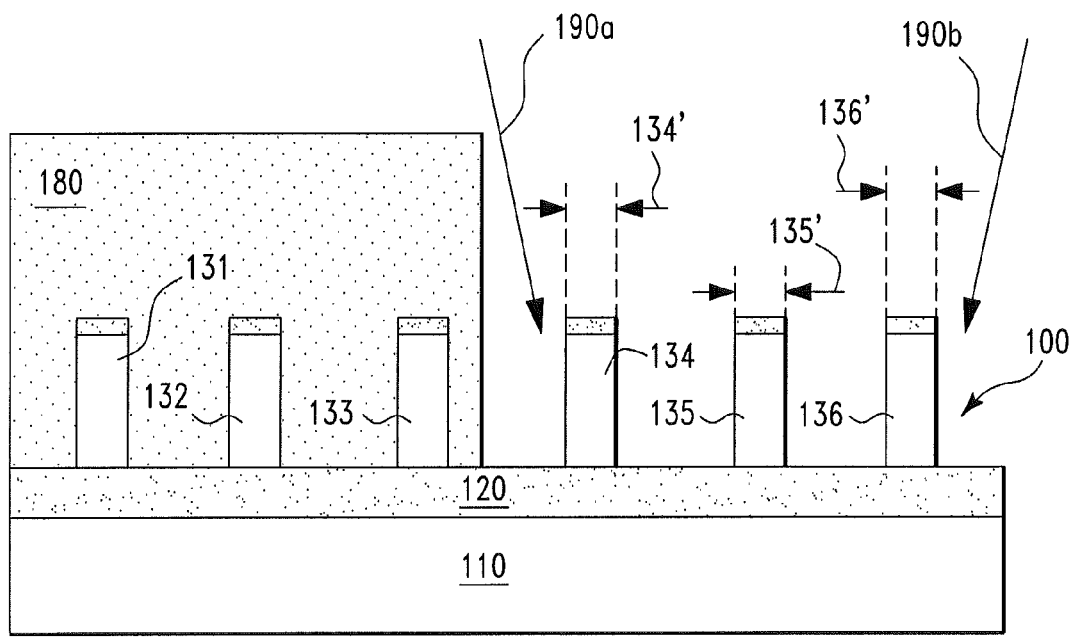

Next, with reference to FIG. 1L, in one embodiment, a photoresist region 180 is formed on top of the fin regions 131, 132, and 133 such that the fin regions 131, 132, and 133 are not exposed to the surrounding ambient and such that the fin regions 134, 135, and 136 are exposed to the surrounding ambient. The photoresist region 180 can be formed by a lithographic process.

Next, in one embodiment, the fin regions 134, 135, and 136 are doped with p-type dopants by the second base Vt implantation process such that Db' is implanted into each of the fin regions 134, 135, and 136. More specifically, the fin regions 134, 135, and 136 are doped by implanting p-type dopants into the fin regions 134, 135, and 136 with the photoresist region 180 as a blocking mask. In one embodiment, the ion bombardment of the second base Vt implantation process is performed in two bombarding directions defined by arrows 190a and 190b (also called directions 190a and 190b). The directions 190a and 190b are not perpendicular to the top surface 137 of the active silicon layer 130 (FIG. 1C). Alternatively, the ion bombardment of the second base Vt implantation process is performed in one of two directions 190a and 190b. In one embodiment, the energies of ions incident on the fin regions 134, 135, and 136 are sufficiently small such that the second base dose Db' in each of the fin regions 134, 135, and 136 created by the second base Vt implantation process essentially do not depend on the thicknesses 134', 135', and 136' of the fin regions 134, 135, and 136, respectively.

As a result, the combination of Da4 and Db' in the fin region 134 results in Dp4 in the fin region 134. Similarly, the combination of Da5 and Db' in the fin region 135 results in Dp5 in the fin region 135. Similarly, the combination of Da6 and Db' in the fin region 136 results in Dp6 in the fin region 136. Because the fin regions 131, 132, and 133 are covered by the photoresist region 180, the fin regions 131, 132, and 133 are not affected by the second base Vt implantation process. After the second base Vt implantation process is performed, the photoresist region 180 is removed by wet etching resulting in the structure 100 of FIG. 1M.

Figure 1M:
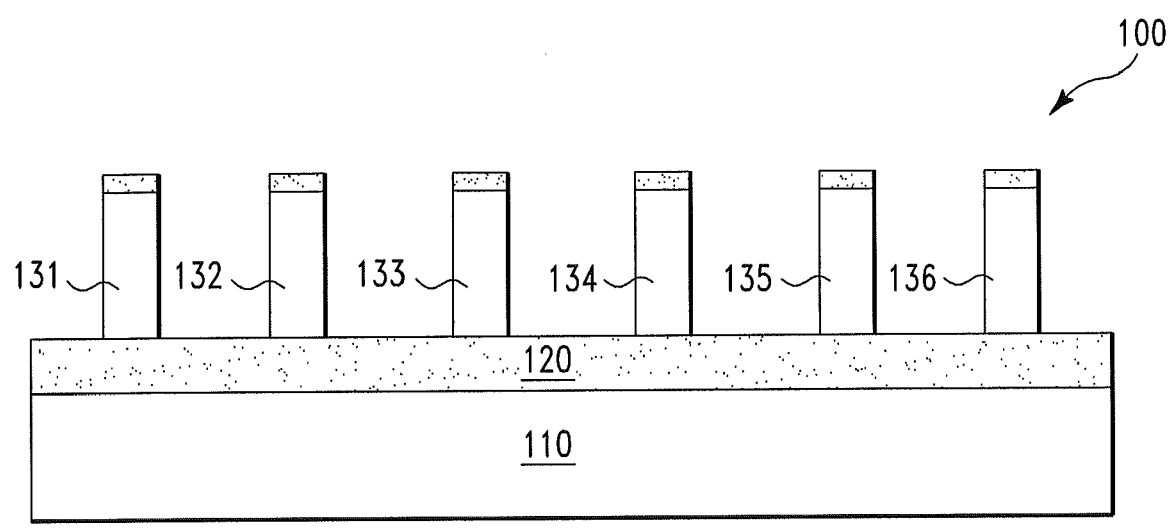

Next, in one embodiment, the first, second, third, fourth, fifth, and sixth FETs (not shown) are formed on the fin regions 131, 132, 133, 134, 135, and 136 of the structure 100 of FIG. 1M, respectively. It should be noted that Dp1, Dp2, Dp3, Dp4, Dp5, and Dp6 that have been implanted into the fin regions 131, 132, 133, 134, 135, and 136 help result in the threshold voltages Vt1, Vt2, Vt3, Vt4, Vt5, and Vt6 of the first, second, third, fourth, fifth, and sixth FETs, respectively.

In summary, the threshold voltages Vt1, Vt2, and Vt3 of the first, second, and third FETs are achieved by, among other things, the individual adjustment Vt implantation processes 151', 152', and 153', respectively, followed by the first base Vt implantation process. The threshold voltages Vt4, Vt5, and Vt6 of the fourth, fifth, and sixth FETs are achieved by, among other things, the individual adjustment Vt implantation processes 154', 155', and 156', respectively, followed by the second base Vt implantation process.

With reference to FIG. 1C, it should be noted that the adjustment Vt implantation process 151' is performed in the direction 151' which is perpendicular to the top surface 137 of the active silicon layer 130. Therefore, the advantage of the adjustment Vt implantation process 151' is that ions implanted into the fin region 131 in the direction 151' are not affected (are not obstructed) by the patterned photoresist layer 150a. It is well known that the dose of dopants in the fin region 131 created by the adjustment Vt implantation process 151' (ion implantation in vertical direction) depends on the thickness 131' of the fin region 131. This dependency is undesirable.

With reference to FIG. 1K, it should be noted that the first base Vt implantation process is performed in the directions 170a and 170b, wherein the directions 170a and 170b are not perpendicular to the top surface 137 of the active silicon layer 130 (FIG. 1C). It should be noted that because the energies of ions incident on the fin regions 131, 132, and 133 are sufficiently small, the doses of dopants in the fin regions 131, 132, and 133 created by the first base Vt implantation process essentially do not depend on the thicknesses 131', 132', and 133' of the fin regions 131, 132, and 133, respectively. The disadvantage of the first base Vt implantation process is that ions implanted into the fin regions 131, 132, and 133 in the directions 170a and 170b are affected (i.e., are obstructed) by the photoresist region 160. This obstruction can be seen clearly in FIG. 1K when ions are implanted into the fin regions 131, 132, and 133 in the direction 170b.

In the embodiments described above, Dp1 in the fin region 131 is achieved by the combination of the adjustment Vt implantation process 151' and the first base Vt implantation process. Therefore, this combination (i) takes the advantage and (ii) reduces the disadvantage of both the adjustment Vt implantation process 151' and the first base Vt implantation process. Therefore, this combination of the present invention is better than the prior art in which Dp1 in the fin region 131 is achieved by either (a) ion implantation in vertical direction or (b) ion implantation in slant direction. Similarly, the other implantation processes to implant Dp2, Dp3, Dp4, Dp5, and Dp6 into the fin regions 132, 133, 134, 135, and 136, respectively, are also better than the prior art.

In the description above, it is assumed that $\Delta Vt1>0$, $\Delta Vt2>0$, and $\Delta Vt3>0$. Assume alternatively that $\Delta Vt1<0$, whereas $\Delta Vt2>0$ and $\Delta Vt3>0$. Therefore, in one embodiment, $\Delta Vt1$ can be achieved by (i) implanting the first adjustment dose of n-type dopants Dan1 and then (ii) implanting the first base dose of p-type dopants Db into the body region 131, wherein the combination of Dan1 and Db in the fin region 131 results in $\Delta Vt1$.

In the description above, it is assumed that Db<Dp1, Db<Dp2, and Db<Dp3 (wherein Db is the first base dose of p-type dopants). Assume alternatively that Db is selected such that Db>Dp1, whereas Db<Dp2 and Db<Dp3. As a result, $\Delta Vt1$ can be achieved by (i) implanting the first adjustment dose of n-type dopants Dan2 and then (ii) implanting the first base dose of p-type dopants Db into the body region 131, wherein the combination of Dan2 and Db in the fin region 131 results in $\Delta Vt1$.

In the description above, it is assumed that Db is the first base dose of p-type dopants. Assume alternatively that Db is selected such that Db is the first base dose of n-type dopants. As a result, $\Delta Vt1$ can be achieved by (i) implanting the first adjustment dose of p-type dopants Da1' and then (ii) implanting the first base dose of n-type dopants Db into the body region 131, wherein the combination of Da1' and Db in the fin region 131 results in $\Delta Vt1$. Similarly, $\Delta Vt2$ can be achieved by (i) implanting the second adjustment dose of p-type dopants Da2' and then (ii) implanting the first base dose of n-type dopants Db into the body region 132, wherein the combination of Da2' and Db in the fin region 132 results in $\Delta Vt2$. Similarly, $\Delta Vt3$ can be achieved by (i) implanting the third adjustment dose of p-type dopants Da3' and then (ii) implanting the first base dose of n-type dopants Db into the body region 133, wherein the combination of Da3' and Db in the fin region 133 results in $\Delta Vt3$.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A semiconductor structure fabrication method, comprising:

providing a semiconductor structure which includes a semiconductor substrate and a pad layer comprising silicon dioxide, wherein the semiconductor substrate includes a top substrate surface which defines a reference direction perpendicular to the top substrate surface and pointing from outside to inside of the semiconductor substrate, wherein the semiconductor substrate further includes a silicon substrate, a buried oxide layer on and in direct physical contact with the silicon substrate, and an active silicon layer on and in direct physical contact with the buried oxide layer, and wherein the pad layer is on and in direct physical contact with the active silicon layer such that the active silicon layer is disposed between the buried oxide layer and the pad layer;

specifying a semiconductor body region within the active silicon layer such that the semiconductor body region is surrounded by a remaining portion of the active silicon layer;

specifying a change in threshold voltage of a transistor which is to be formed on the semiconductor body region;

selecting an adjustment dose of dopants of a first doping polarity;

selecting a base dose of dopants of a second doping polarity;

forming a photoresist layer on and in direct physical contact with the pad layer;

patterning the photoresist layer resulting in a trench in the photoresist layer such that the trench is aligned over the entire semiconductor body region in the reference direction and such that a portion of the pad layer between the trench and the semiconductor body region is directly exposed to the trench;

after said patterning the photoresist layer and said selecting the adjustment dose of dopants, implanting the adjustment dose of dopants into the semiconductor body region by an adjustment implantation process in which the adjustment dose of dopants is implanted into the semiconductor body region after passing through the trench and the portion of the pad layer, wherein ion bombardment of the adjustment implantation process is in the reference direction;

after said implanting the adjustment dose of dopants, removing the photoresist layer;

after said removing the photoresist layer, patterning the active silicon layer and the pad layer resulting in side walls of the semiconductor body region and sidewalls of the portion of the pad layer being exposed to a surrounding ambient;

after said patterning the active silicon layer and the pad layer and said specifying the change in threshold voltage of the transistor and said selecting the base dose of dopants, implanting the base dose of dopants into the semiconductor body region by a base implantation process, wherein ion bombardment of the base implantation process is in a direction which makes a non-zero angle with the reference direction, and wherein the adjustment dose of dopants and the base dose of dopants were selected such that a combination of the adjustment dose of dopants and the base dose of dopants results in the change in the threshold voltage of the transistor.

2. The method of claim 1, wherein the first and second doping polarities are identical.

3. The method of claim 1, wherein the first and second doping polarities are identical.

4. The method of claim 3, wherein the first doping polarity is p-type.

5. The method of claim 3, wherein the first doping polarity is n-type.

6. The method of claim 1, wherein the first and second doping polarities are different.

7. The method of claim 6, wherein the first doping polarity is p-type.

8. The method of claim 6, wherein the first doping polarity is n-type.

9. A semiconductor structure fabrication method, comprising:

providing a semiconductor structure which includes a semiconductor substrate and a pad layer comprising silicon dioxide, wherein the semiconductor substrate includes a top substrate surface which defines a reference direction perpendicular to the top substrate surface and pointing from outside to inside of the semiconductor substrate, wherein the semiconductor substrate further includes a silicon substrate, a buried oxide layer on and in direct physical contact with the silicon substrate, and an active silicon layer on and in direct physical contact with the buried oxide layer, and wherein the pad layer is on and in direct physical contact with the active silicon layer such that the active silicon layer is disposed between the buried oxide layer and the pad layer;

specifying a first semiconductor body region and a second semiconductor body region within the active silicon layer such that the first semiconductor body region and the second semiconductor body region are each surrounded by a remaining portion of the active silicon layer;

specifying a first change in threshold voltage of a first transistor which is to be formed on the first semiconductor body region;

specifying a second change in threshold voltage of a second transistor which is to be formed on the second semiconductor body region;

selecting a first adjustment dose of dopants of a first doping polarity;

selecting a second adjustment dose of dopants of a second doping polarity;

selecting a base dose of dopants of a third doping polarity;

forming a first photoresist layer on and in direct physical contact with the pad layer;

patterning the first photoresist layer resulting in a first trench in the first photoresist layer such that the first trench is aligned over the entire first semiconductor body region in the reference direction and such that a first portion of the pad layer between the first trench and the first semiconductor body region is directly exposed to the first trench;

after said patterning the first photoresist layer and said selecting the first adjustment dose of dopants, implanting the first adjustment dose of dopants into the first semiconductor body region by a first adjustment implantation process, wherein ion bombardment of the first adjustment implantation process is in the reference direction;

after said implanting the first adjustment dose of dopants, removing the first photoresist layer;

after said removing the first photoresist layer, forming a second photoresist layer on and in direct physical contact with the pad layer;

patterning the second photoresist layer resulting in a second trench in the second photoresist layer such that the second trench is aligned over the entire second semiconductor body region in the reference direction and such that a second portion of the pad layer between the second trench and the second semiconductor body region is directly exposed to the second trench;

after said patterning the second photoresist layer and said selecting the second adjustment dose of dopants, implanting the second adjustment dose of dopants into the second semiconductor body region by a second adjustment implantation process, wherein ion bombardment of the second adjustment implantation process is in the reference direction;

after said implanting the second adjustment dose of dopants, removing the second photoresist layer;

after said removing the second photoresist layer, patterning the active silicon layer and the pad layer resulting in side walls of the first and second semiconductor body regions being exposed to a surrounding ambient;

after said patterning the active silicon layer and the pad layer and said specifying the first and second change in threshold voltage of the first and second transistor, respectively, and said selecting the base dose of dopants, implanting the base dose of dopants into each semiconductor body region of the first and second semiconductor body regions by a base implantation process, wherein ion bombardment of the base implantation process is in a direction which makes a non-zero angle with the reference direction, wherein the first and second adjustment dose of dopants and the base dose of dopants were selected such that a combination of the first adjustment dose of dopants and the base dose of dopants results in the first change in the threshold voltage of the first transistor and such that a combination of the second adjustment dose of dopants and the base dose of dopants results in the second change in the threshold voltage of the second transistor.

10. The method of claim 9, wherein the first, second, and third doping polarities are identical.

11. The method of claim 9,
wherein the first and second doping polarities are different, and
wherein the second and third doping polarities are identical.

12. The method of claim 9,
wherein the first and second doping polarities are identical, and
wherein the first and third doping polarities are different.

13. A semiconductor structure fabrication method, comprising:

providing a semiconductor structure which includes a semiconductor substrate and a pad layer comprising silicon dioxide, wherein the semiconductor substrate includes a top substrate surface which defines a reference direction perpendicular to the top substrate surface and pointing from outside to inside of the semiconductor substrate, wherein the semiconductor substrate further includes a silicon substrate, a buried oxide layer on and in direct physical contact with the silicon substrate, and an active silicon layer on and in direct physical contact with the buried oxide layer, and wherein the pad layer is on and in direct physical contact with the active silicon layer such that the active silicon layer is disposed between the buried oxide layer and the pad layer;

specifying a first semiconductor body region and a second semiconductor body region within the active silicon layer such that the first semiconductor body region and the second semiconductor body region are each surrounded by a remaining portion of the active silicon layer;

specifying a first change in threshold voltage of a first transistor which is to be formed on the first semiconductor body region;

specifying a second change in threshold voltage of a second transistor which is to be formed on the second semiconductor body region;

selecting a first adjustment dose of dopants of a first doping polarity;

selecting a second adjustment dose of dopants of a second doping polarity;

selecting a first base dose of dopants of a third doping polarity;

selecting a second base dose of dopants of a fourth doping polarity;

forming a first photoresist layer on and in direct physical contact with the pad layer;

patterning the first photoresist layer resulting in a first trench in the first photoresist layer such that the first trench is aligned over the entire first semiconductor body region in the reference direction and such that a first portion of the pad layer between the first trench and the first semiconductor body region is directly exposed to the first trench;

after said patterning the first photoresist layer and said selecting the first adjustment dose of dopants, implanting the first adjustment dose of dopants of into the first semiconductor body region by a first adjustment implantation process, wherein ion bombardment of the first adjustment implantation process is in the reference direction;

after said implanting the first adjustment dose of dopants, removing the first photoresist layer;

after said removing the first photoresist layer, forming a second photoresist layer on and in direct physical contact with the pad layer;

patterning the second photoresist layer resulting in a second trench in the second photoresist layer such that the second trench is aligned over the entire second semiconductor body region in the reference direction and such that a second portion of the pad layer between the second trench and the second semiconductor body region is directly exposed to the second trench;

after said patterning the second photoresist layer and said selecting the second adjustment dose of dopants, implanting the second adjustment dose of dopants into the second semiconductor body region by a second adjustment implantation process, wherein ion bombardment of the second adjustment implantation process is in the reference direction;

after said implanting the second adjustment dose of dopants, removing the second photoresist layer;

after said removing the second photoresist layer, patterning the active silicon layer and the pad layer resulting in side walls of the first and second semiconductor body regions being exposed to a surrounding ambient;

after said patterning the active silicon layer and the pad layer and said specifying the first change in threshold voltage of the first transistor and said selecting the first base dose of dopants, implanting the first base dose of dopants into the first semiconductor body region by a first base implantation process, wherein ion bombardment of the first base implantation process is in a first direction which makes a first non-zero angle with the reference direction; and after said implanting the first base dose of dopants and said specifying the second change in threshold voltage of the second transistor and said selecting the second base dose of dopants, implanting the second base dose of dopants into the second semiconductor body regions by a second base implantation process, wherein ion bombardment of the second base implantation process is in a second direction which makes a second non-zero angle with the reference direction, wherein the first and second adjustment dose of dopants and the first and second base dose of dopants were selected such that a combination of the first adjustment dose of dopants and the first base dose of dopants results in the first change in the threshold voltage of the first transistor and such that a combination of the second adjustment dose of dopants and the second base dose of dopants results in the second change in the threshold voltage of the second transistor.

14. The method of claim 13, wherein the first and third doping polarities are identical.

15. The method of claim 13, wherein the first and third doping polarities are different.

16. The method of claim 13, wherein the second and fourth doping polarities are identical.

17. The method of claim 13, wherein the second and fourth doping polarities are different.

* * * * *